(12) United States Patent
Chen et al.

(10) Patent No.: US 7,409,751 B2
(45) Date of Patent: Aug. 12, 2008

(54) CLIP FOR HEAT SINK

(75) Inventors: Chun-Chi Chen, Tu-Cheng (TW); Shi-Wen Zhou, Shenzhen (CN); Zhan Wu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 6 days.

(21) Appl. No.: 11/309,220

(22) Filed: Jul. 13, 2006

(65) Prior Publication Data

US 2008/0010788 A1    Jan. 17, 2008

(51) Int. Cl.
 *A44B 21/00* (2006.01)
 *H05K 7/20* (2006.01)

(52) U.S. Cl. ............... 24/455; 24/457; 257/718; 257/727; 257/E23.086

(58) Field of Classification Search ............ 174/16.3; 165/80.3; 257/718, 727, E23.086; 24/457, 24/458, 455; 361/704, 710, 719
See application file for complete search history.

(56) References Cited

U.S. PATENT DOCUMENTS

| | | | | |
|---|---|---|---|---|
| 5,617,292 | A * | 4/1997 | Steiner | 361/706 |
| 6,318,452 | B1 | 11/2001 | Lee | |
| 6,731,504 | B1 | 5/2004 | Liu | |
| 7,215,550 | B1 * | 5/2007 | Yang et al. | 361/704 |
| 2004/0179340 | A1 * | 9/2004 | Lin | 361/704 |
| 2004/0190262 | A1 * | 9/2004 | Lai et al. | 361/704 |
| 2005/0144764 | A1 * | 7/2005 | Lin | 24/459 |
| 2006/0133038 | A1 * | 6/2006 | Yu et al. | 361/697 |
| 2007/0025083 | A1 * | 2/2007 | Lin | 361/704 |

* cited by examiner

*Primary Examiner*—Robert J. Sandy (57) ABSTRACT

A clip includes a body having a first end and a second end. A connecting member extends through the first end of the body. A hook plate is attached to a bottom of the connecting member and an actuating member is pivotally coupled to an upper end of the connecting member. The actuating member is pivotable relative to the hook plate in a first direction so that the actuating member is turnable relative to the hook plate between a locked position and an unlocked position. Furthermore, the actuating member is turnable about an axis of the connecting member in a second direction different from the first direction.

17 Claims, 14 Drawing Sheets

CLIP FOR HEAT SINK

FIELD OF THE INVENTION

The present invention relates to a clip for a heat sink, more particularly to a clip which can readily and securely attach a heat sink to an electronic device.

DESCRIPTION OF RELATED ART

A heat sink is usually placed in thermal contact with an electronic package, such as a central processing unit (CPU) and transfers heat through conduction away from the electronic package so as to prevent over-heating of the electronic package. Usually a heat sink is secured to an electronic package by a clip.

Figure 14:
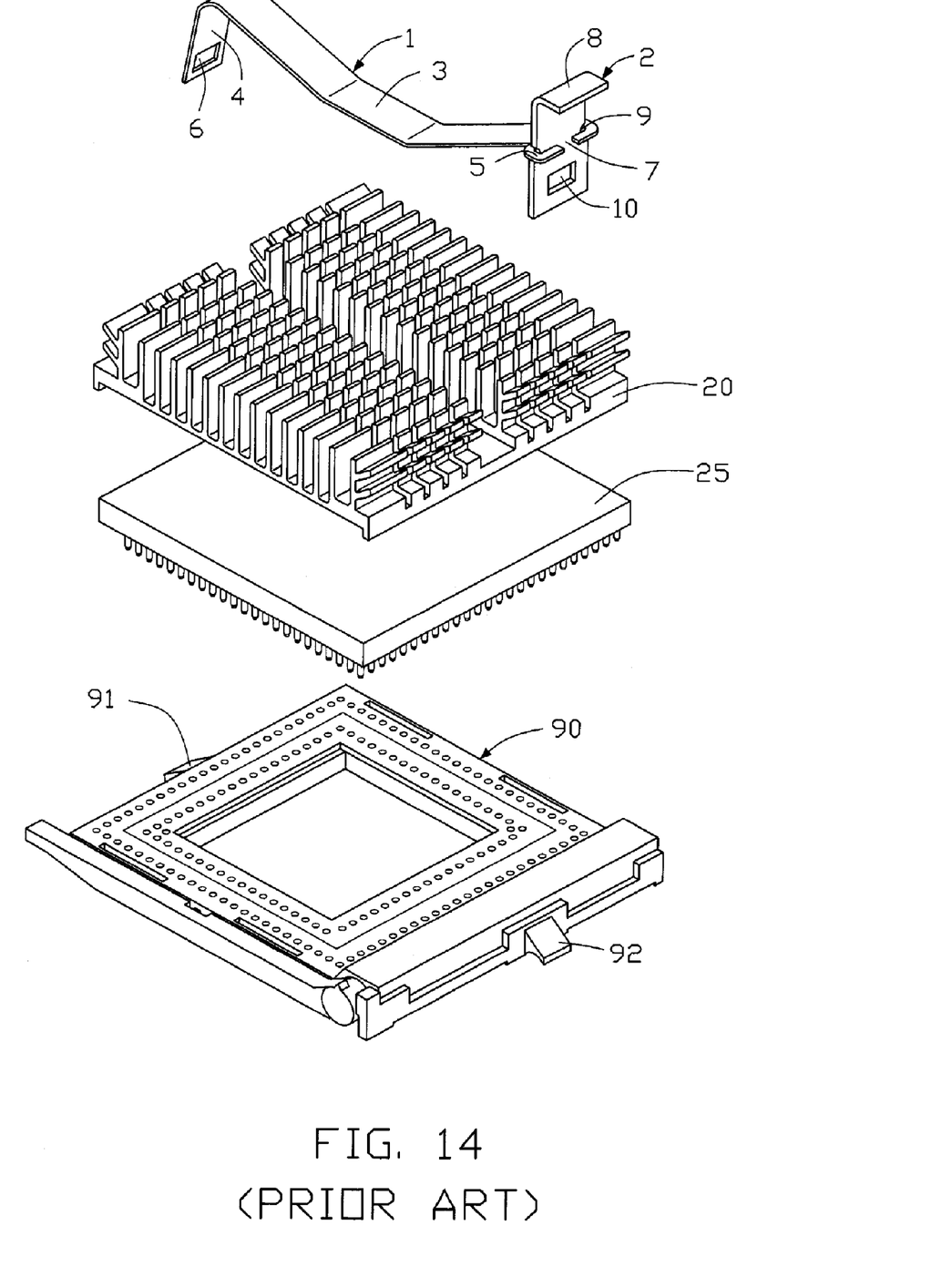
FIG. 14 is a perspective view of a conventional clip.

Referring to FIG. 14, a conventional clip comprises a first member 1 and a second member 2 coupled to the first member 1. The clip secures a heat sink 20 to a CPU module 25 fitting into a socket board 90. The first member 1 includes a spring portion 3 with a leg 4 extending from an end of the spring portion 3. The leg 4 defines a first slot 6 for engagement with a catch 91 of the socket board 90. A pair of arms 5 extend from an opposite end of the spring portion 3 to define a receiving space 7 for receiving the second member 2 therein. The second member 2, which is L-shaped, comprises a handle portion 8 extending above the spring portion 3 of the first member 1 for manual operation and a lower portion opposite the leg 4 defining a second slot 10 for engaging a second catch 92 of the socket board 90. The second member 2 defines a pair of notches 9 on opposite sides thereof for engaging with the arms 5 of the first member 1, thereby connecting the first member 1 to the second member 2. The spring portion 3 is deformed to impart a spring force to the heat sink 20 for securing the heat sink 20 and the CPU module 25 to the socket board 90.

However, a relatively large force is required to operate the handle portion 8 for fixing the heat sink 20 to the CPU module 25. This makes it difficult to attach and detach the clip from the socket board 90.

SUMMARY OF THE INVENTION

A clip comprises a body having a first end and a second end, a hook plate coupled to the first end of the body, an actuating member and a connecting member extending through the first end of the body pivotally and coupled the hook plate to the actuating member. A supporting portion is formed at the first end of the body and a fixing structure is formed at the second end. The actuating member is supported on the supporting portion and can be pivoted relative to the hook plate in a first direction so that the actuating member is turnable relative to the hook plate between a locked position and an unlocked position. The actuating member is turnable about an axis of the connecting member wherein the actuating member can be pivoted relative to the hook plate in a second direction different from the first direction.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Referring to FIGS. 1-4, a clip 100 in accordance with a preferred embodiment of the present invention is illustrated. The clip 100 is used to secure a heat sink to an electronic package; it comprises an elongated body 110, a first hook plate 120, a second hook plate 130, an actuating member 140 and a connecting member 150.

Figure 1:
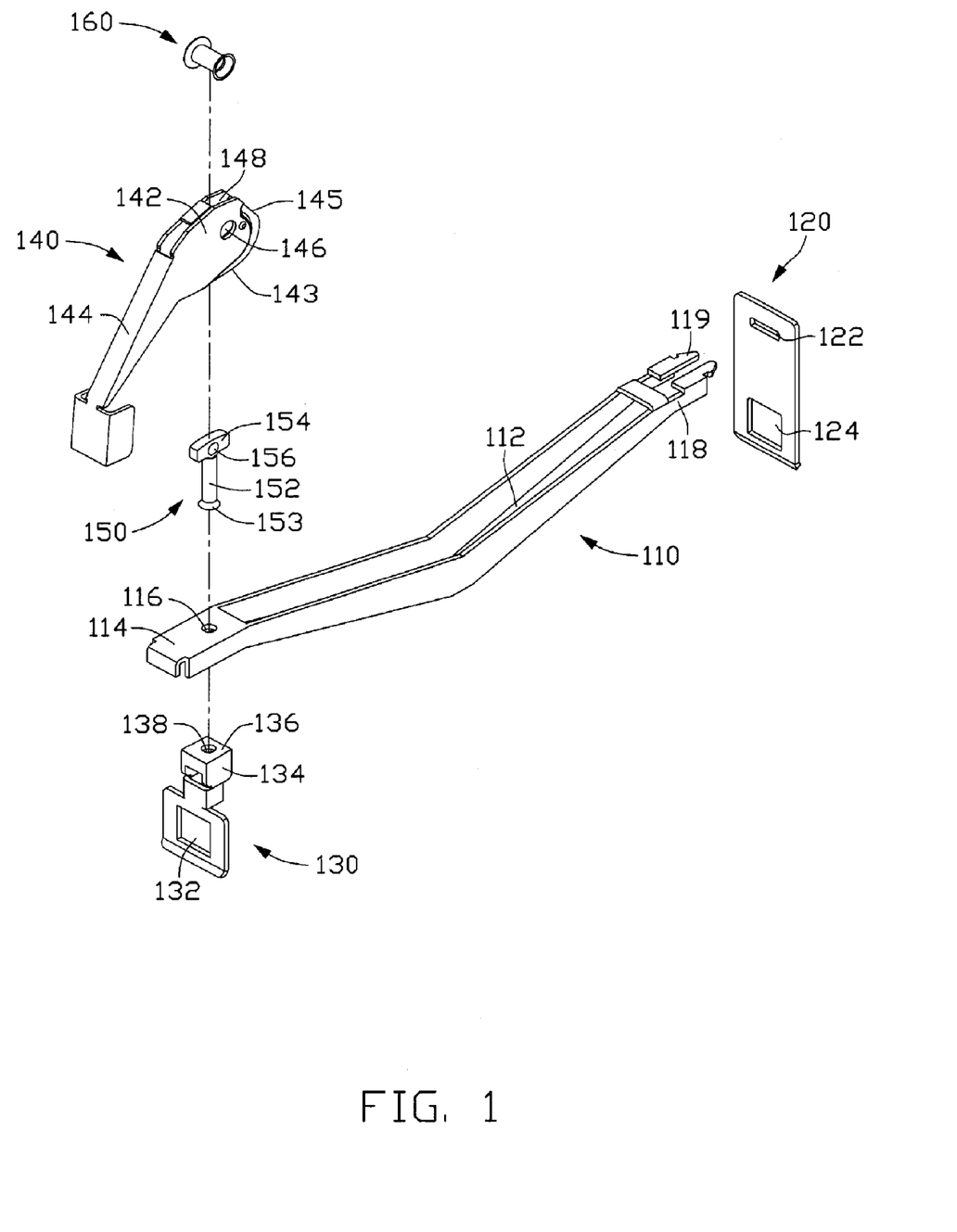
FIG. 1 is an exploded view of a clip in accordance with a preferred embodiment of the present invention.

The body 110 is a substantially V-shaped member with an elongated slot 112 defined therein to reinforce the elasticity of the body 110. The body 110 has a first end terminating in a flat supporting portion 114 with a hole 116 defined therethrough, and an opposite second end terminating in a pair of spaced flexible arms 118. Each arm 118 has a barb 119 formed at a free end thereof for engaging with the first hook plate 120 to fasten the body 110 to the first hook plate 120.

The first hook plate 120 is a flat plate member having a retaining hole 122 and a hook hole 124 being respectively defined in opposite top and bottom sides thereof. The retaining hole 122 is used to receive and engage with the barbs 119 of the body 110 thus coupling the first hook plate 120 to the body 110. The hook hole 124 is for receiving a locking member set on one side of the electronic package.

Figure 2:
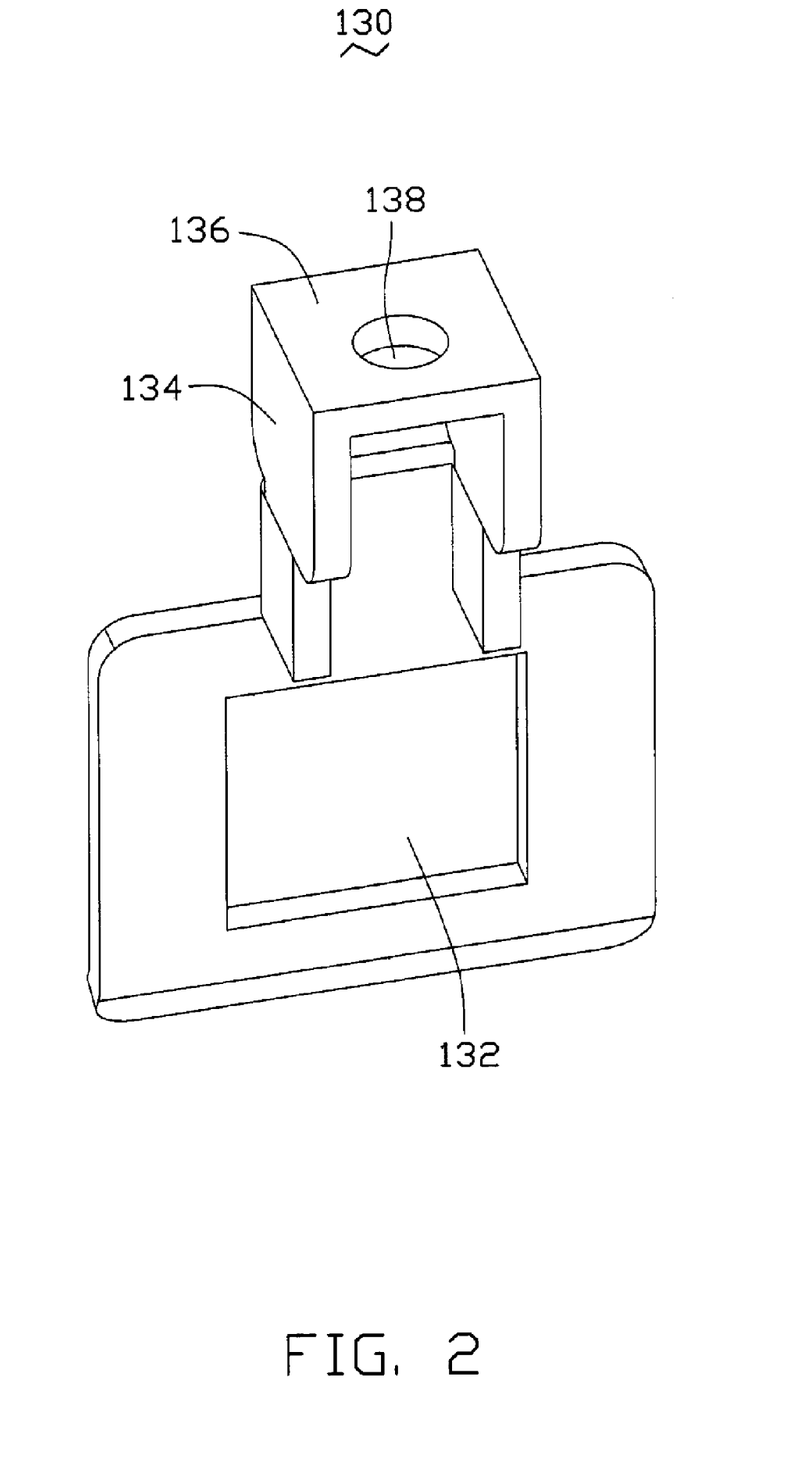
FIG. 2 is an enlarged view of a hook plate of the clip in FIG. 1, viewed form a different aspect.

The second hook plate 130 defines a hook hole 132 corresponding to and engaging with another locking member set on another side of the electronic package. A pair of legs 134 upwardly extend from opposite sides of the second hook plate 130. A connecting portion 136 with a receiving hole 138 defined therethrough extends between the two legs 134. The connecting portion 136 and the two legs 134 together form a cap-shaped structure with the receiving hole 138 located in a top portion thereof for being pivotally connected to the actuated member 140 through the connecting member 150.

The connecting member 150 has a substantially T-shaped configuration. It comprises a cylinder portion 152 with a bottom flange 153 and a beam portion 154 transversely extending from an upper portion of the cylinder portion 152. The cylinder portion 152 extends downwards through the hole 116 of the flat supporting portion 114 and engages with the receiving hole 138 of the second hook plate 130, positioning the beam portion 154 above the supporting portion 114 of the body 110. When the cylinder portion 152 extends through the receiving hole 138 of the second hook plate 130 via elastic deformation of the flange 153 thereof, the flange 153 of the cylinder portion 152 returns to its previous form and serves as a stop preventing the cylinder portion 152 from escaping from the receiving hole 138 of the second hook plate 130. The beam portion 154 defines a pivot hole 156 therein for being pivotably connected to the actuating member 140 via a pivot 160.

The actuating member 140 comprises a cam 142 and a handle lever 144 extending from an end of the cam 142. A pivot hole 146 axially extends through the cam 142, and a slot 148 radially extends through the cam 142 across the pivot hole 146. The cam 142 comprises an engagement portion 143 and a release portion 145 in the periphery. The distance between the pivot hole 146 and the engagement portion 143 is greater than the distance between the pivot hole 146 and the release portion 145.

Figure 3:
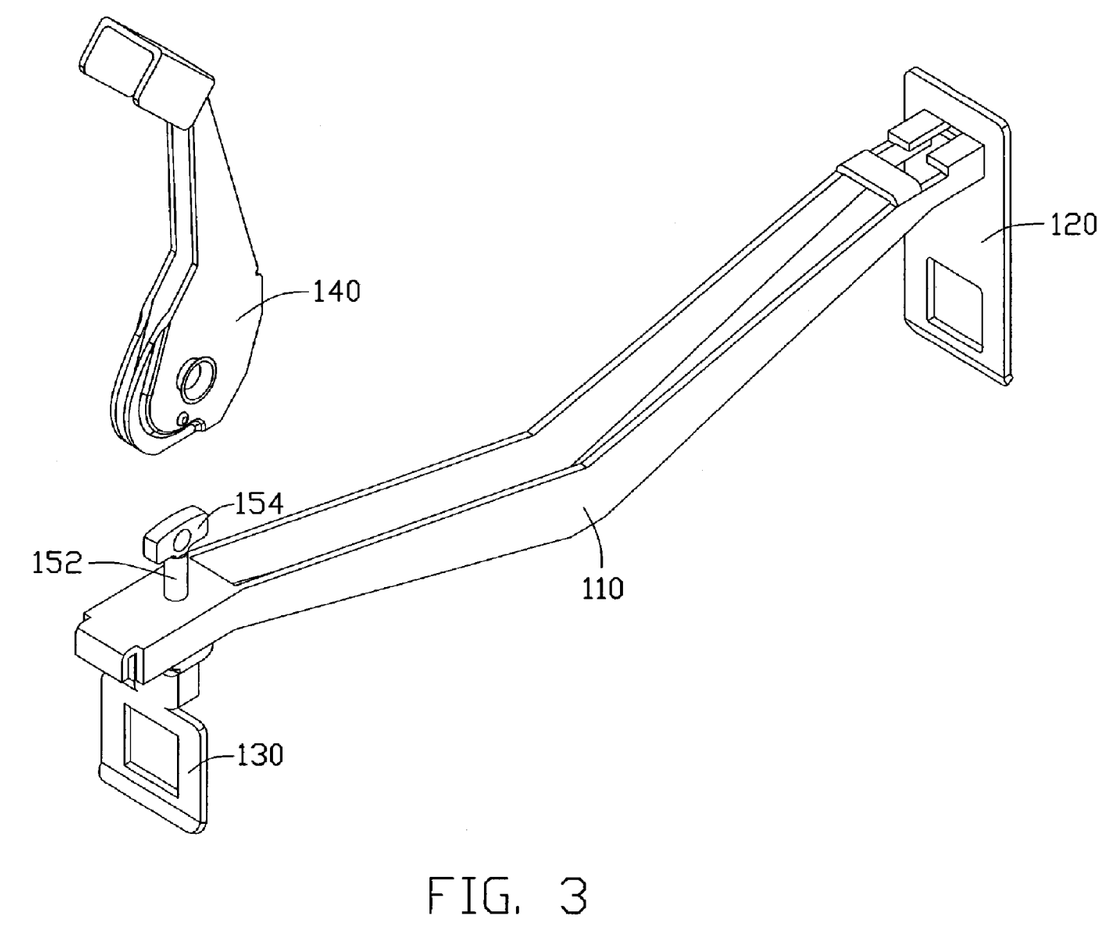
FIG. 3 is a partly assembly view of the clip in FIG. 1.
Figure 4:
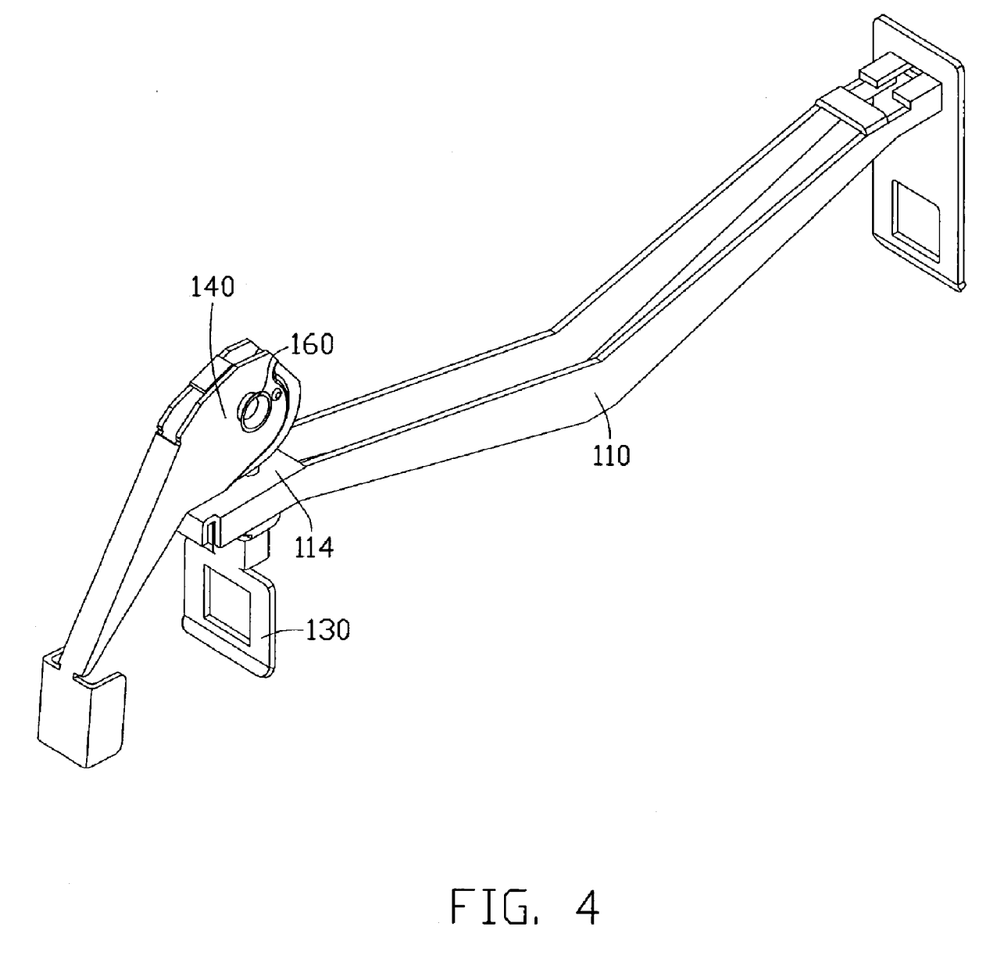
FIG. 4 is an assembly view of the clip in FIG. 1.
Figure 5:
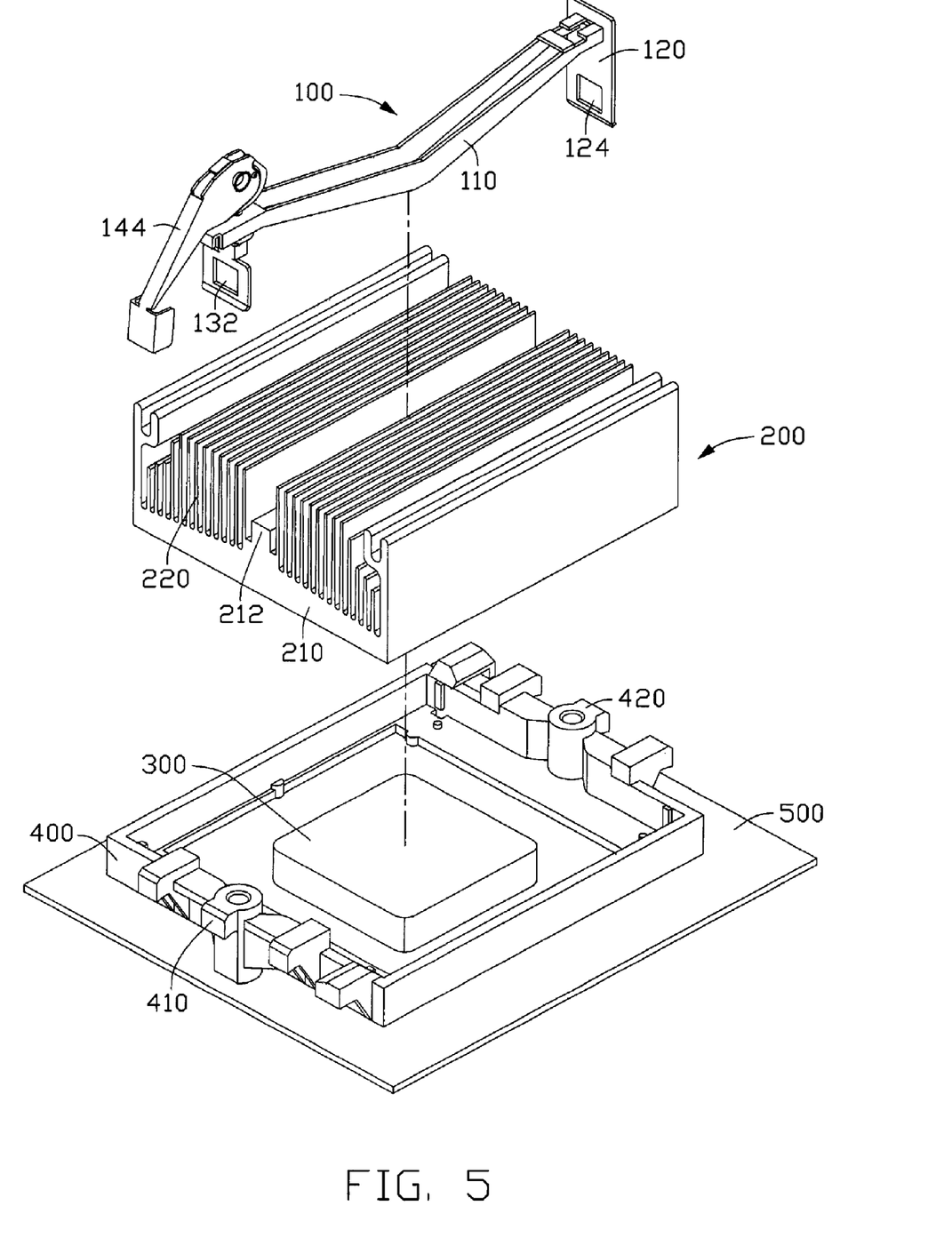
FIG. 5 is an exploded view of the clip securing a heat sink onto an electronic package.
Figure 6:
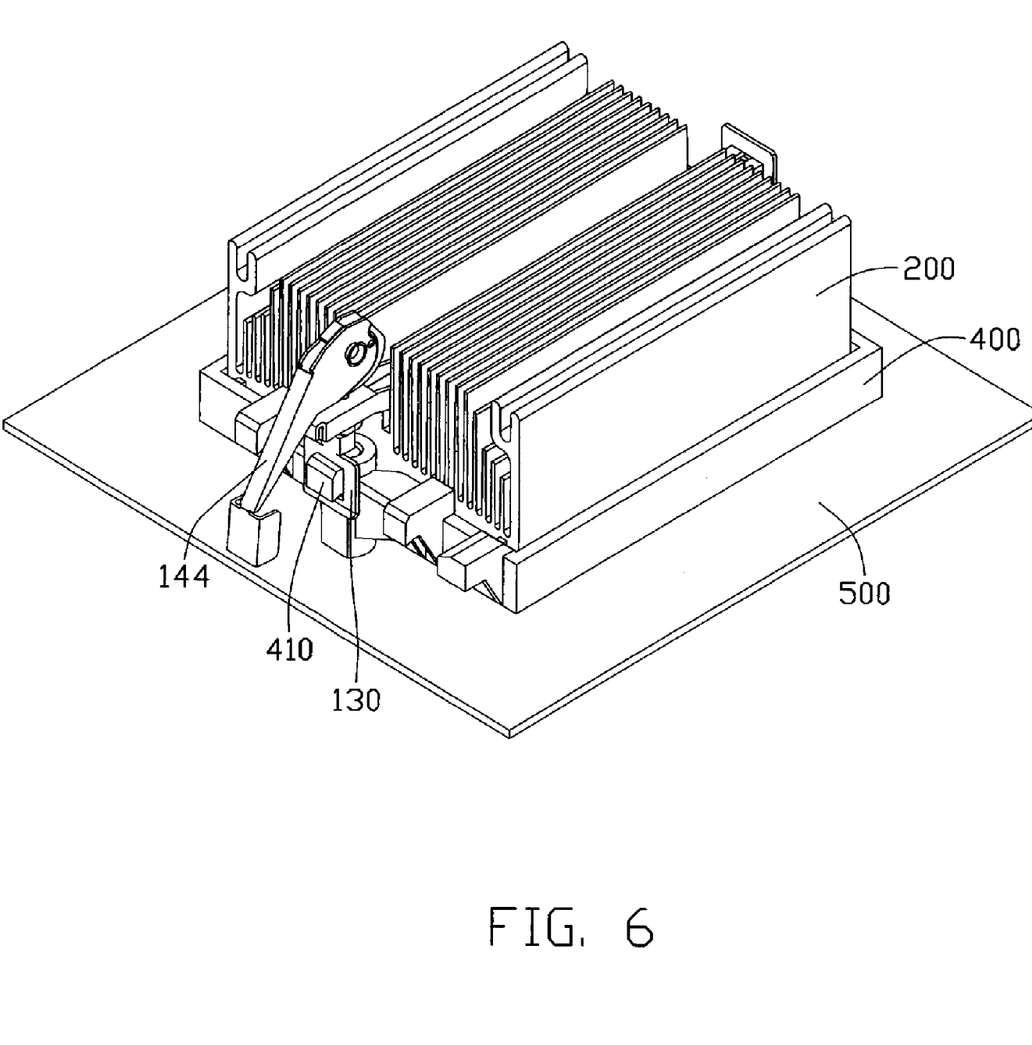
FIG. 6 is an assembly view of FIG. 5, showing an actuating member of the clip turned to a locked position.

During the assembly process of the clip 100, the first hook plate 120 is first coupled to the second end of the body 110. Then, the cam 142 of the actuating member 140 is supported on the supporting portion 114 of the body 110, and the cap-shaped structure of the second hook plate 130 is located under the supporting portion 114 of the body 110 and the cam 142. The cylinder portion 152 of the connecting member 150 is then inserted downwards through the hole 116 of the supporting portion 114 and pivotally engaged with the receiving hole 138 of the second hook plate 130, thereby positioning the beam portion 154 above the supporting portion 114 of the body 110. The pivot 160 is then fastened to the pivot hole 146 of the actuating member 140 and the pivot hole 156 of the connecting member 150 to pivotally secure the actuating member 140 to the second hook plate 130 and the body 110. When assembled, the user can turn the actuating member 140 about the pivot 160 relative to the second hook plate 130 between a first position, namely, the locked position where the engagement portion 143 is maintained in close contact with the supporting portion 114 of the body 110, and a second position, namely, the unlocked position where the release portion 145 is maintained in close contact with the supporting portion 114 of the body 110. Furthermore, the connecting member 150 can rotate around its axis; thus, the actuating member 140 can also rotate relative to the second hook plate 130 around the axis of the cylinder portion 152 no matter whether the actuating member 140 is in the locked position or the unlocked position.

Figure 7:
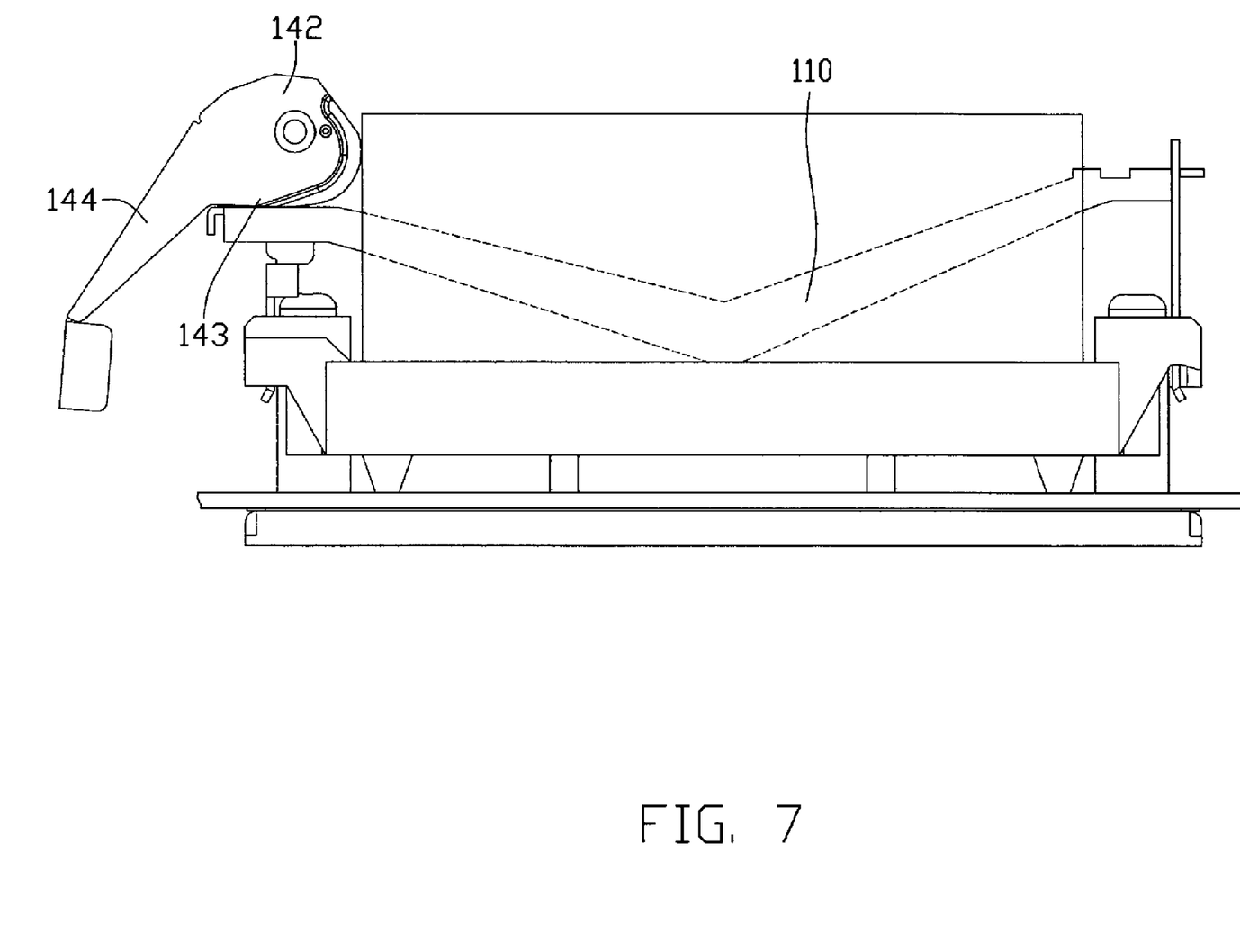
FIG. 7 is a side view of FIG. 6.
Figure 8:
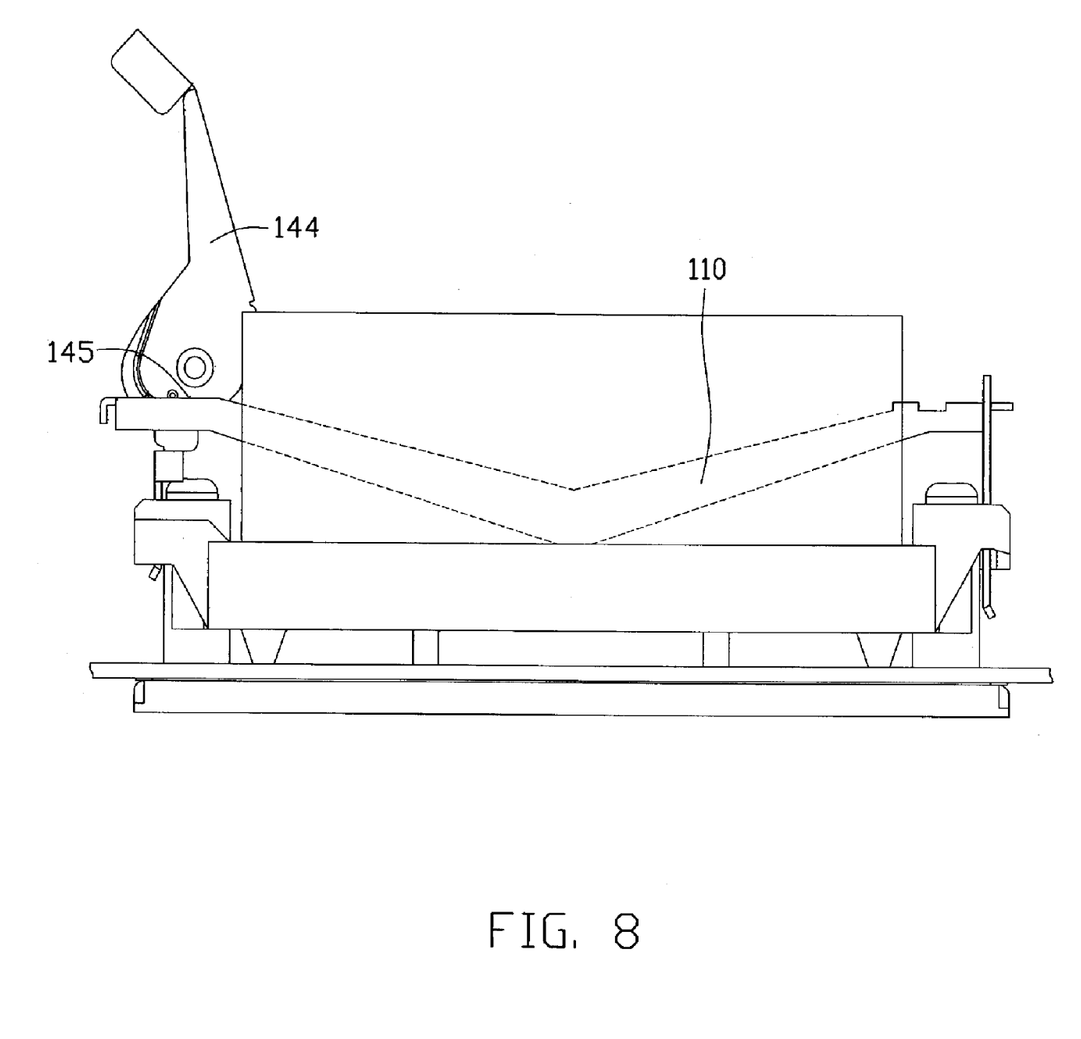
FIG. 8 is similar to FIG. 7, but shows the actuating member turned to an unlocked position.
Figure 9:
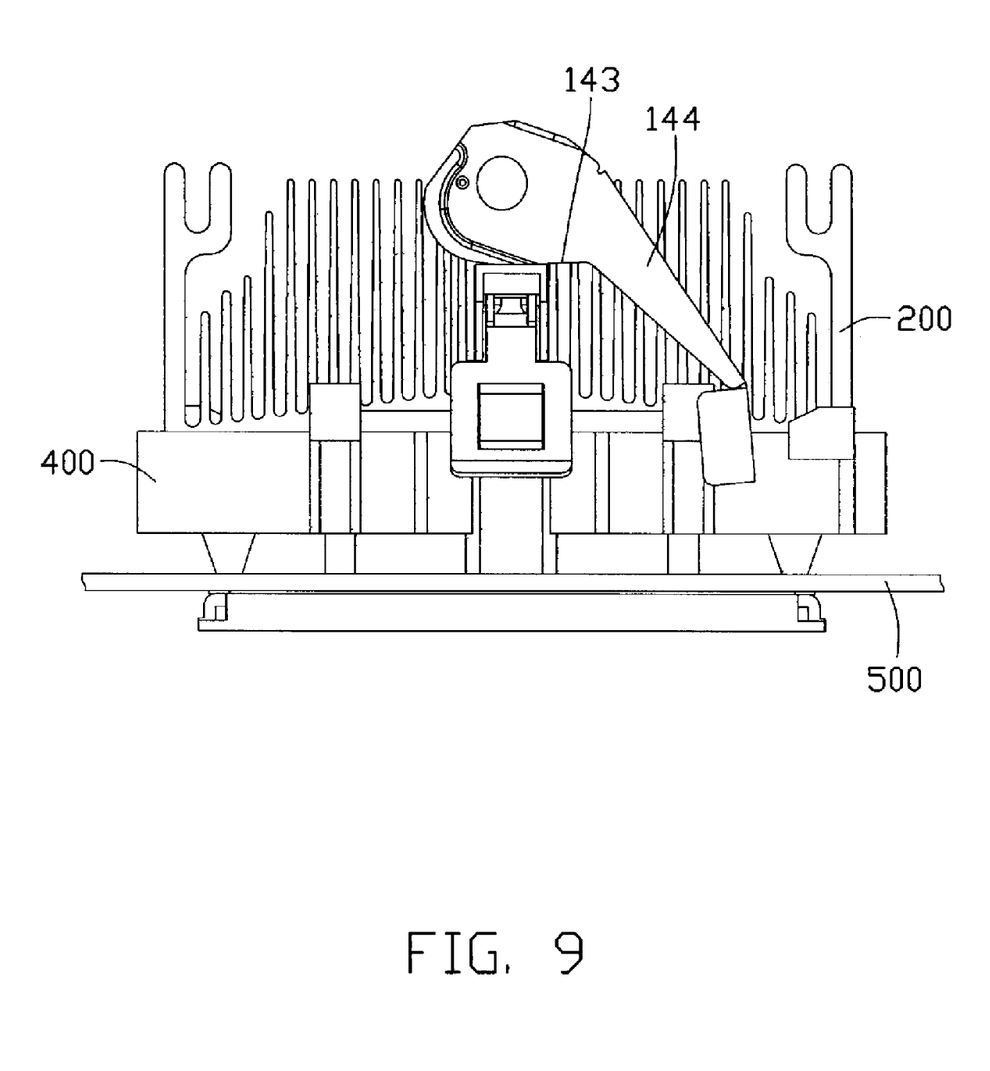
FIG. 9 is similar to FIG. 6, but shows the actuating member turning around an axis of a connecting member of the clip about 90 degrees viewed from lateral side.

Referring to FIGS. 5-9, the aforesaid clip 100 is adapted to attach a heat sink 200 on a top surface of an electronic package such as a CPU 300 in a retention module 400 on a motherboard 500. The heat sink 200 comprises a base 210 having a bottom surface thereof in thermal contact with the CPU 300 and a plurality of fins 220 mounted on the top surface of the base 210. A locating protrusion 212 protrudes upwardly from a top surface of the base 210 and is received in the slot 112 of the body 110 of the clip 100; thus, the clip 100 is positioned on the base 210 of the heat sink 200. The hook hole 124 of the first plate 120 is then hung on a catch 420 at one side of the retention module 400. The hook hole 132 of the second hook plate 130 is subsequently forced into engagement with another locking member in a form of another catch 410 at an opposing side of the retention module 400. Then the handle lever 144 is turned by hand from the unlocked position to the locked position to force the engagement portion 143 of the cam 142 into close contact with the supporting portion 114 of the body 110. When installed, the hook holes 124, 132 of the first and second hook plates 120,130 respectively, are stopped below their respective catches 420, 410 of the retention module 400. When set in the locked position, the body 110 is deformed and imparts a downward pressure onto the heat sink 200 keeping the bottom surface of the heat sink 200 in close contact with the top surface of the CPU 300. As shown in FIG. 7, the handle lever 144 is positioned to extend outwardly from the body 110 in a manner substantially in line with the body 110. The handle lever 144 can be forced to rotate round the axis of the cylinder portion 152 of the connecting member 150 to a suitable place, preferably where the handle lever 144 is oriented perpendicular to the body 110 and closely attached to one vertical periphery side of the heat sink 200 as shown in FIG. 9. Thus, the installation of the clip 100 does not occupy much space.

When unlocked the clip 100, the handle lever 144 is forced to rotate from the locked position to the unlocked position, that is moving the engagement portion 143 of the cam 142 away from the supporting portion 114 of the body 110 and forcing the release portion 145 of the cam 142 into contact with the supporting portion 114. The hook holes 124,132 of the first and second hook plates 120, 130 are thereby disengaged from the constraint of the corresponding catches 420, 410 of the retention module 400, and the user can easily remove the clip 100 from the retention module 400 and the heat sink 200.

As described above, the handle lever 144 can rotate around the pivot 160 in a first plane, and it can also rotate around the axis of the cylinder portion 152 in a second plane perpendicular to the first plane. Therefore, the clip 100 can be rotated around the axis of the cylinder portion 152 to a certain plane, which forms an angle together with the body. The angle is about 0~90 degrees, including 0 degrees (shown in FIG. 4) and 90 degrees (shown in FIG. 9). This facilitates manual operation of the clip 100, particularly when there is a block in the way and the handle lever 144 can not make its way to the locked or unlocked position in a certain plane, for example, in a plane perpendicular to the body 110, that is where the angle is 90 degrees. In that case, the handle lever 144 can be first rotated through a certain angle, for example about 40 degrees around the axis of the cylinder portion 152, to push the block out of the way; then the handle lever 144 can be pressed to rotate around the pivot 160 to move toward the locked position; finally, the handle lever 144 in the locked position can be forced to rotate round the axis of the cylinder portion 152 and is positioned in the plane perpendicular to the body 110.

Figure 10:
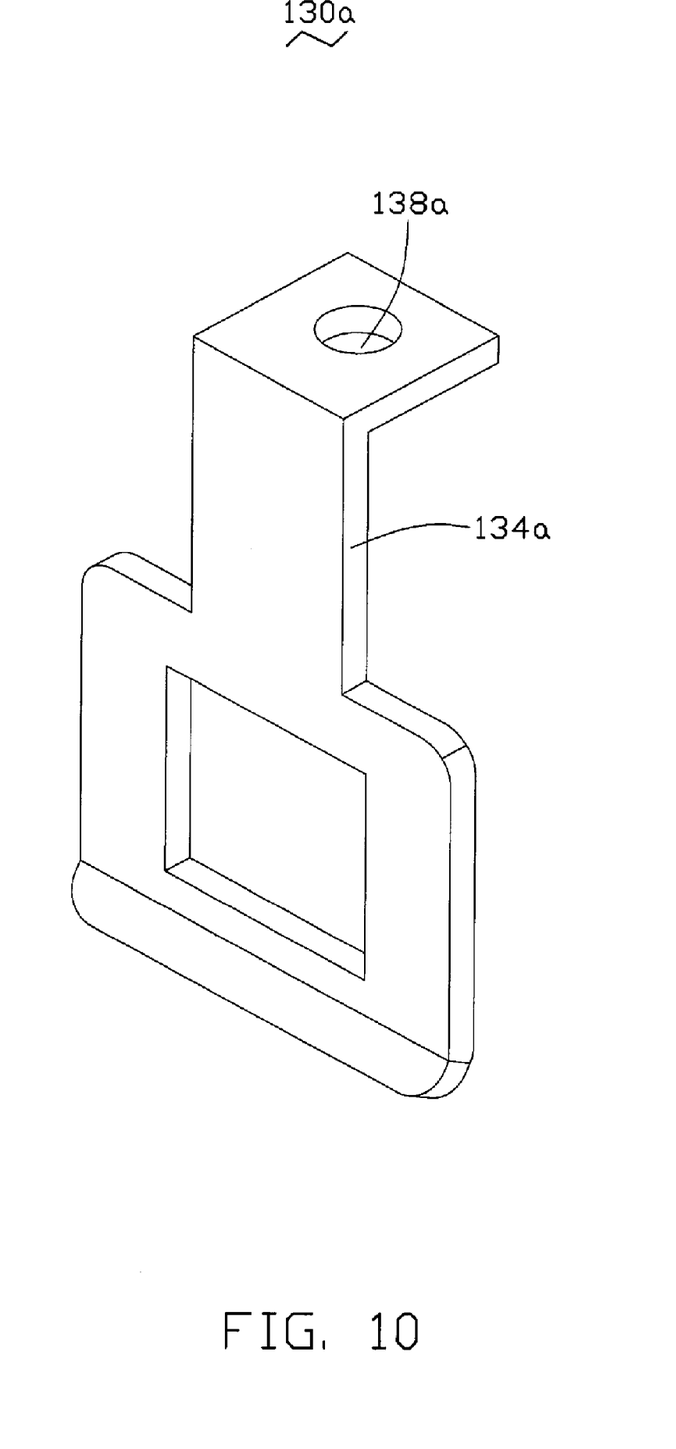
FIG. 10 is a perspective view of a hook plate in accordance with another preferred embodiment of the present invention.

In the preferred embodiment described above, the second hook plate 130 comprises a cap-shaped structure. In another embodiment shown in FIG. 10, the second hook plate 130a comprises an L-shaped leg 134a extending from a top middle part thereof. A receiving hole 138a is defined in a top portion of the leg 134a for receiving and engaging with the connecting member 150.

Figure 11:
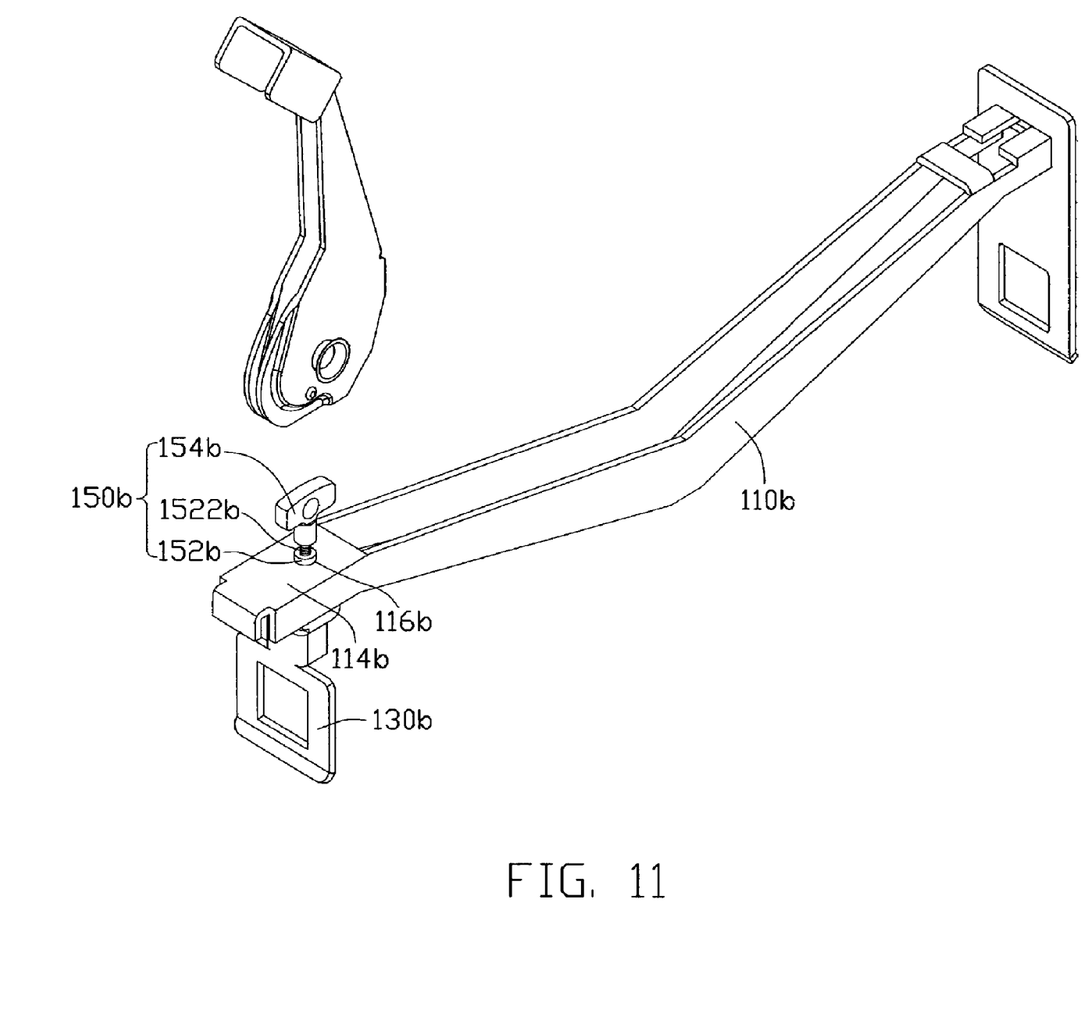
FIG. 11 is a partly exploded view of a clip in accordance with another preferred embodiment of the present invention.
Figure 12:
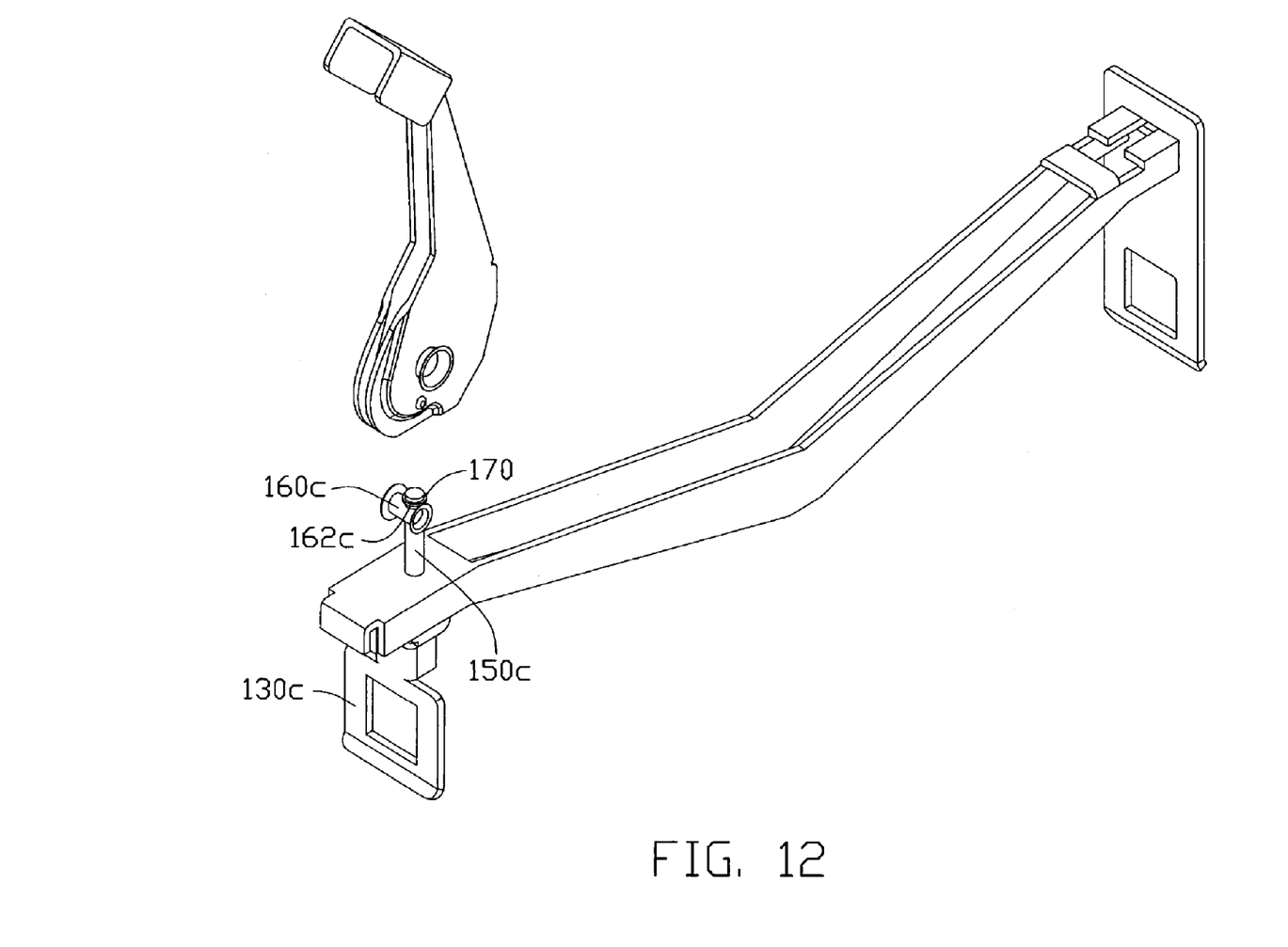
FIG. 12 is a partly exploded view of a clip in accordance with another preferred embodiment of the present invention.

In the preferred embodiment described above, the connecting member 150 has a T-shaped configuration, in another embodiment (not shown in the drawing), the connecting member 150 may have a simple cylinder figuration with a pivot hole radially defined therethrough. In another embodiment shown in FIG. 11, the connecting member 150b comprises two detachable parts, namely, a lower part 152b with an end portion having an external screw 1522b and a top part 154b with an end portion having an internal screw. The lower part 152b extends through the receiving hole (not shown) of the second hook plate 130b and the hole 116b of the supporting portion 114*b* of the body 110*b* for screwing into the top part 154*b*. In yet another embodiment, shown in FIG. 12, the connecting member 150*c* has a cylindrical configuration and is inserted from bottom side to topside to extend through the receiving hole (not shown) of the second hook plate 130*c*, the hole (not labeled) of the supporting portion (not labeled) and a mounting hole 162*c* defined in a pivot 160*c*. A C-shaped ring 170 then snaps onto a top of the connecting member 150*c* thereby connecting the connecting member 150*c* and the pivot 160*c* together; thus, the connecting member 150*c* connects these components together. The pivot 160*c* is rotatable relative to the connecting member 150*c*. The actuating member is finally pivotably connected to the pivot 160*c*. In this case, the connecting member 150*c* may be integrally formed with the second hook plate 130.

Figure 13:
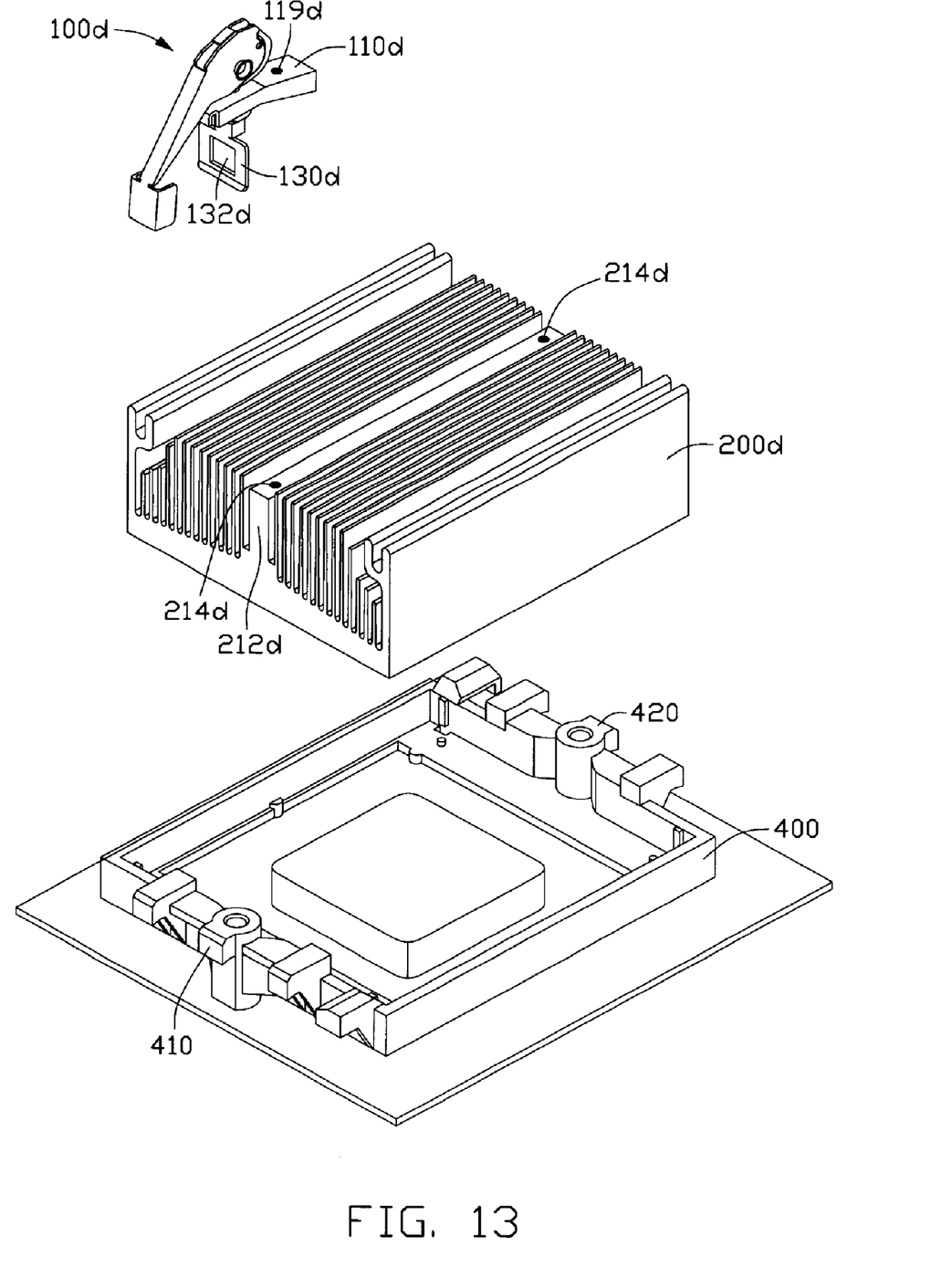
FIG. 13 is an exploded view of a clip securing a heat sink onto an electronic package in accordance with another preferred embodiment of the present invention.

In the preferred embodiments described above, each clip comprises a V-shaped body stretching across the base 210 of the heat sink 200. In another embodiment shown in FIG. 13, a body 110*d* of a clip 100*d* is a flat plate member. The body 110*d* defines a screw hole 119*d* therein corresponding to a screw hole 214*d* defined in a top portion and near a side of the locating protrusion 212*d*, which in this embodiment is raised to a level near a top of the heat sink 200*d*. The body 110*d* is fastened to the heat sink 200*d* via a screw (not shown) engaging with the screw hole 119*d* of the body 110*d* and the screw hole 214*d* of the heat sink 200*d*. Therefore, the screw hole 119*d* of the body 110*d* serves as a fixing structure to fix the body 110*d* to the heat sink 200*d*. In a similar manner as described above, the hook hole 132*d* of the hook plate 130*d* is engaged or disengaged from the constraint of the catch 410 of the retention module 400 by manipulating the actuating member of the clip 100*d*. Another clip (not shown) having a structure the same as the clip 100*d* is attached to another screw hole 214*d* at an opposite side of the heat sink 200*d*, which can engage or disengage from the catch 420 of the retention module 400. Therefore, the clip 100*d* together with another clip mounted on opposing sides of the heat sink 200*d* secure the heat sink 200*d* to a top surface of the CPU 300.

In the preferred embodiments as described above, the clip engages with the locking members in the form of the catches 410, 420 of the retention module 400 so as to mount the heat sink to the CPU 300. However, the locking members may be in other forms, such as fixing poles located on the printed circuit board 500 and surrounding the CPU 300 to be cooled, or a pair of legs of a back plate extending through the PCB 500 and surrounding the CPU 300, wherein the back plate abuts against a bottom side of the PCB 500 opposite to the CPU 300 to be cooled.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A clip, comprising:
    a body having a first end and a second end, a supporting portion formed at the first end and a fixing structure formed at the second end;
    a hook plate coupled to the first end of the body;
    an actuating member supported on the supporting portion; and
    a connecting member extending through the first end of the body and coupling the hook plate to the actuating member, wherein the actuating member is pivotable relative to the hook plate in a first direction so that the actuating member is turnable relative to the hook plate between a locked position and an unlocked position, the actuating member being turnable about an axis of the connecting member wherein the actuating member is pivotably attached to the hook plate in a second direction different from the first direction;
    wherein the connecting member comprises a lower part pivotally and detachably coupled to the hook plate and an upper part pivotally coupled to the actuating member.

2. The clip as claimed in claim 1, wherein the second direction is substantially perpendicular to the first direction.

3. The clip as claimed in claim 1, wherein a hole is defined through the supporting portion for the connecting member extending through.

4. The clip as claimed in claim 3, further comprising a pivot with a mounting hole defined therein, the pivot being rotatably mounted to the connecting member by extending the connecting member through the mounting hole, and the actuating member being pivotably mounted to the pivot.

5. The clip as claimed in claim 4, wherein the connecting member is integrally formed with the hook plate.

6. The clip as claimed in claim 3, wherein the hook plate has a hook hole defined therein for engaging with a catch of a retention module.

7. The clip as claimed in claim 6, wherein the lower part extends through a receiving hole of the hook plate above the hook hole thereof and the hole of the supporting portion of the body for engaging with the top part.

8. The clip as claimed in claim 1, wherein the lower part of the connecting member has a screw formed at a top end thereof, the screw threadedly connecting with the top part of the connecting member.

9. The clip as claimed in claim 1, wherein the connecting member has a T-shaped configuration.

10. The clip as claimed in claim 1, wherein the fixing structure is a pair of barbs.

11. The clip as claimed in claim 10, further comprising another hook plate having a retaining hole and a hook hole defined in opposite top and bottom sides thereof, respectively, wherein the retaining hole is used to receive and engage the barbs of the body to couple the another hook plate to the body, and the hook hole is for mounting with a catch of a retention module.

12. A heat sink assembly, comprising:
    a heat sink comprising:
    a base in thermal contact with an electronic component mounted to a side of a printed circuit board (PCB) with locking members located around the electronic component; and
    a plurality of fins mounted on the base; and
    a clip adapted to secure the heat sink to the electronic component, comprising:
    a body supported on the base of the heat sink, the body having a first end and a second end, a supporting portion formed at the first end and a fixing structure formed at the second end;
    a hook plate coupled to the first end of the body and having a hook hole defined therein for engaging with one of the locking member;
    an actuating member supported on the supporting portion; and
    a connecting member extending through the first end of the body and coupling the hook plate to the actuating member wherein the actuating member can be vertically pivoted relative to the connecting member, the actuating member being turnable about an axis of the connecting member wherein the actuating member can be rotated horizontally relative to the hook plate within a range of angle of about 0~90 degrees;

wherein the connecting member is pivotally and detachably engaging with the hook plate so that the connecting member is turnable about the axis thereof.

13. The clip as claimed in claim 12, wherein a hole is defined through the supporting portion for the connecting member extending through.

14. The clip as claimed in claim 13, wherein the connecting member is pivotally coupled to a pivot, which pivotally couples the connecting member to the actuating member.

15. The clip as claimed in claim 12, wherein a locating protrusion is formed on a side of the base opposite to the electronic component the body of the clip being supported on the locating protrusion by a screw connecting the body of the clip and the locating protrusion together.

16. The clip as claimed in claim 13, wherein the body of the clip is generally a V-shaped member stretching across the base of the heat sink, the heat sink having a locating protrusion extending through the body of the clip.

17. The clip as claimed in claim 16, further comprising another hook plate having a retaining hole and a hook hole defined in opposite top and bottom sides thereof, respectively, wherein the retaining hole is used to couple the another hook plate to the body, and the hook hole is for engaging with another one of the locking members.

* * * * *